United States Patent
Ho

(10) Patent No.: US 11,257,799 B2
(45) Date of Patent: Feb. 22, 2022

(54) OPTICAL SENSOR MODULE AND METHOD FOR MANUFACTURING THE SAME

(71) Applicant: Advanced Semiconductor Engineering, Inc., Kaohsiung (TW)

(72) Inventor: Hsin-Ying Ho, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 16/404,337

(22) Filed: May 6, 2019

(65) Prior Publication Data

US 2019/0259741 A1    Aug. 22, 2019

Related U.S. Application Data

(63) Continuation of application No. 14/691,434, filed on Apr. 20, 2015, now abandoned.

(51) Int. Cl.
*H01L 25/16* (2006.01)
*H01L 31/12* (2006.01)
(Continued)

(52) U.S. Cl.
CPC .......... *H01L 25/167* (2013.01); *G01S 7/4813* (2013.01); *G01S 17/04* (2020.01);
(Continued)

(58) Field of Classification Search
CPC ............. H01L 31/12; H01L 31/14–173; H01L 33/483–486; H01L 31/0203;
(Continued)

(56) References Cited

U.S. PATENT DOCUMENTS 5,824,951 A * 10/1998 Tanaka .................... H01L 23/10
                                                                    174/564
6,567,435 B1    5/2003 Scott et al.
(Continued)

FOREIGN PATENT DOCUMENTS

CN    1378381 A  * 11/2002   ........... H04N 5/2253
CN    1224243 C  * 10/2005   ....... H01L 27/14625
(Continued)

OTHER PUBLICATIONS

Non-Final Office Action U.S. Appl. No. 14/691,434, dated Jan. 4, 2019, 13 pages.
(Continued)

*Primary Examiner* — Joshua King
(74) *Attorney, Agent, or Firm* — Foley & Lardner LLP

(57) ABSTRACT

An optical sensor module includes: (1) a lid defining a first chamber and a second chamber isolated from the first chamber; (2) a light emitting component disposed within the first chamber; and (3) a light sensing component disposed within the second chamber; wherein the lid includes a capping substrate and a top of the first chamber and a top of the second chamber are demarcated by the capping substrate, wherein the capping substrate defines a first penetrating hole at the top of the first chamber and a first runner connecting a side wall of the first penetrating hole, and wherein a first lens or a first transmissive panel is formed or disposed in the first penetrating hole and has an extension formed or disposed in the first runner connecting the side wall of the first penetrating hole.

20 Claims, 13 Drawing Sheets

(51) Int. Cl.
| | |
|---|---|
| *H01L 31/0203* | (2014.01) |
| *H01L 31/0232* | (2014.01) |
| *H01L 31/167* | (2006.01) |
| *H01L 31/173* | (2006.01) |
| *H02S 40/44* | (2014.01) |
| *G01S 7/481* | (2006.01) |
| *G01S 17/04* | (2020.01) |

(52) U.S. Cl.
CPC .... *H01L 31/0203* (2013.01); *H01L 31/02325* (2013.01); *H01L 31/12* (2013.01); *H01L 31/167* (2013.01); *H01L 31/173* (2013.01); *H02S 40/44* (2014.12); *H01L 2224/48091* (2013.01)

(58) Field of Classification Search
CPC . H01L 2224/48091; H01L 2924/00014; H01S 5/02288; H01S 5/02296; H01S 5/0262; H01S 5/0264
See application file for complete search history.

(56) References Cited

U.S. PATENT DOCUMENTS

| | | | | |
|---|---|---|---|---|
| 7,046,344 | B2* | 5/2006 | Yamamoto | G01C 3/08 356/4.01 |
| 7,583,862 | B2* | 9/2009 | Tuttle | H01L 27/14618 382/312 |
| 7,816,697 | B1* | 10/2010 | Spurlock | H01L 31/02325 257/98 |
| 8,053,799 | B2* | 11/2011 | Kwon | H01L 33/483 257/98 |
| 8,289,632 | B2 | 10/2012 | Ohata et al. | |
| 8,674,305 | B2* | 3/2014 | Rossi | G01V 8/12 250/341.8 |
| 8,716,665 | B2* | 5/2014 | Yao | G01S 17/04 250/338.1 |
| 8,884,347 | B2* | 11/2014 | Nihei | H01L 27/14618 257/281 |
| 9,052,492 | B2 | 6/2015 | Chen et al. | |
| 9,252,337 | B1* | 2/2016 | Cumpston | H01L 33/20 |
| 9,291,495 | B2* | 3/2016 | Land | G01S 17/04 |
| 9,465,442 | B2* | 10/2016 | Rai | G06F 3/017 |
| 9,466,769 | B2* | 10/2016 | Halbritter | H01L 33/58 |
| 9,564,569 | B1* | 2/2017 | Wang | H01L 25/167 |
| 10,097,264 | B2* | 10/2018 | Venugopalan Nair Jalakumari | H04B 10/502 |
| 10,475,937 | B1* | 11/2019 | Jones | H01L 31/125 |
| 2002/0163054 | A1* | 11/2002 | Suda | H01L 27/14627 257/431 |
| 2005/0013562 | A1* | 1/2005 | Tatehata | G02B 6/4206 385/93 |
| 2005/0110889 | A1* | 5/2005 | Tuttle | H01L 27/14636 348/340 |
| 2005/0230772 | A1* | 10/2005 | Vittu | H01L 27/14618 257/432 |
| 2006/0043512 | A1* | 3/2006 | Oliver | H01L 27/14685 257/433 |
| 2006/0220232 | A1* | 10/2006 | Tanida | H01L 27/14618 257/723 |
| 2006/0243889 | A1* | 11/2006 | Farnworth | H01L 27/14683 250/208.1 |
| 2006/0256086 | A1 | 11/2006 | Xie et al. | |
| 2006/0284845 | A1 | 12/2006 | Wu et al. | |
| 2007/0210267 | A1* | 9/2007 | Ishii | G01S 17/48 250/559.36 |
| 2007/0235743 | A1* | 10/2007 | Lee | H01L 33/483 257/81 |
| 2008/0007927 | A1 | 1/2008 | Ito et al. | |
| 2009/0159900 | A1 | 6/2009 | Basoor et al. | |
| 2009/0225431 | A1* | 9/2009 | Lee | H01L 27/14685 359/621 |
| 2009/0321863 | A1* | 12/2009 | Borthakur | H01L 21/6835 257/432 |
| 2010/0117176 | A1* | 5/2010 | Uekawa | H01L 31/02164 257/432 |
| 2011/0032409 | A1* | 2/2011 | Rossi | G02B 13/0085 348/340 |
| 2011/0121181 | A1 | 5/2011 | Costello et al. | |
| 2011/0316108 | A1* | 12/2011 | Nihei | H01L 27/14623 257/435 |
| 2012/0133956 | A1* | 5/2012 | Findlay | H01L 31/125 356/614 |
| 2013/0019461 | A1* | 1/2013 | Rudmann | G01J 5/045 29/592.1 |
| 2013/0032905 | A1* | 2/2013 | Lo | H01L 21/50 257/416 |
| 2013/0033767 | A1* | 2/2013 | Rudmann | B29D 11/00375 359/722 |
| 2013/0128487 | A1* | 5/2013 | Lo | H01L 23/053 361/813 |
| 2013/0292705 | A1 | 11/2013 | Makimura et al. | |
| 2014/0041214 | A1* | 2/2014 | Barlow | H01L 27/14625 29/841 |
| 2014/0103476 | A1* | 4/2014 | Jin | H01L 31/0203 257/432 |
| 2014/0218340 | A1* | 8/2014 | Rai | G01S 17/04 345/175 |
| 2014/0231635 | A1* | 8/2014 | Kerness | H01L 31/02325 250/226 |
| 2014/0307081 | A1* | 10/2014 | Rudmann | H01L 27/14683 348/86 |
| 2015/0034975 | A1* | 2/2015 | Rudmann | H01L 27/14687 257/82 |
| 2015/0048408 | A1* | 2/2015 | Nam | H01L 33/483 257/99 |
| 2015/0115139 | A1* | 4/2015 | Okushiba | G01S 7/4813 250/216 |
| 2015/0243802 | A1* | 8/2015 | Fujimoto | H01L 33/486 257/82 |
| 2015/0279827 | A1* | 10/2015 | Tu | H01L 31/0203 257/81 |
| 2016/0005931 | A1* | 1/2016 | Lee | H01L 33/505 257/98 |
| 2016/0056194 | A1* | 2/2016 | Rudmann | H01L 27/14621 257/98 |
| 2016/0240721 | A1* | 8/2016 | Chu | G01J 1/0437 |
| 2016/0293585 | A1* | 10/2016 | Geiger | H01L 31/02325 |
| 2017/0287963 | A1* | 10/2017 | Rudmann | H01L 27/14621 |
| 2017/0294560 | A1* | 10/2017 | Ho | H01L 31/02327 |
| 2019/0139947 | A1* | 5/2019 | Saxod | B29C 45/14754 |
| 2019/0259902 | A1* | 8/2019 | Shimizu | G01S 17/10 |
| 2019/0280130 | A1* | 9/2019 | Saxod | H01L 31/12 |

FOREIGN PATENT DOCUMENTS

| | | | | |
|---|---|---|---|---|
| CN | 102033291 A | | 4/2011 | |
| CN | 102053350 A | | 5/2011 | |
| CN | 102313972 A | | 1/2012 | |
| CN | 103424848 A | | 12/2013 | |
| CN | 103797580 A | | 5/2014 | |
| CN | 107785357 A | * | 3/2018 | ........... H01L 31/125 |
| EP | 1239519 A2 | * | 9/2002 | ....... H01L 27/14625 |
| KR | 10-1457500 B1 | | 11/2014 | |
| WO | WO-2008011003 A2 | * | 1/2008 | ............. G02B 7/021 |
| WO | WO-2011156926 A1 | * | 12/2011 | ....... H01L 27/14687 |
| WO | WO-2013026174 A2 | * | 2/2013 | ................ G01J 1/42 |
| WO | WO-2013037556 A1 | * | 3/2013 | ............. H01L 33/48 |
| WO | WO-2013/161722 A1 | | 10/2013 | |
| WO | WO-2013161722 A1 | * | 10/2013 | ........... H01L 31/167 |
| WO | WO-2013172786 A1 | * | 11/2013 | ....... H01L 27/14625 |
| WO | WO-2014/014414 A1 | | 1/2014 | |
| WO | WO-2014031078 A1 | * | 2/2014 | ............. H01L 31/18 |
| WO | WO-2014/109711 A1 | | 7/2014 | |
| WO | WO-2014109711 A1 | * | 7/2014 | ............ H01L 25/167 |
| WO | WO-2014/129968 A1 | | 8/2014 | |
| WO | WO-2014192933 A1 | * | 12/2014 | ............ G02B 3/0062 |

(56) References Cited

FOREIGN PATENT DOCUMENTS

| WO | WO-2015053706 A1 | * | 4/2015 | ....... | H01L 27/14629 |
| WO | WO-2015076750 A1 | * | 5/2015 | ........... | H01L 25/167 |

OTHER PUBLICATIONS

Final Office Action for U.S. Appl. No. 14/691,434, dated Jun. 20, 2018, 12 pages.
Non-Final Office Action U.S. Appl. No. 14/691,434, dated Feb. 20, 2018, 11 pages.
Final Office Action for U.S. Appl. No. 14/691,434, dated Aug. 30, 2017, 16 pages.
Non-Final Office Action for U.S. Appl. No. 14/691,434, dated Mar. 31, 2017, 11 pages.
Office Action for corresponding Chinese Patent Application No. 201610242463.8, dated Jan. 3, 2019, 7 pages.
Search Report for corresponding Chinese Patent Application No. 201610242463.8, dated Jan. 3, 2019, 4 pages.
Office Action for corresponding Chinese Patent Application No. 201610242463.8, dated Sep. 25, 2019, 8 pages.

* cited by examiner

OPTICAL SENSOR MODULE AND METHOD FOR MANUFACTURING THE SAME

CROSS-REFERENCE TO RELATED APPLICATIONS

This application is a continuation of U.S. patent application Ser. No. 14/691,434, filed Apr. 20, 2015, the contents of which are incorporated herein by reference in their entirety.

BACKGROUND

1. Technical Field

The present disclosure relates to an optical sensor module and a method of manufacturing the same. The present disclosure also relates to a portable electronic device including the optical sensor module.

2. Description of the Related Art

An optical sensor module, such as a proximity sensor module, can be used for detecting the presence of an object near the optical sensor module. The optical sensor module includes a light source and an optical sensor. The optical sensor receives or senses light (generally infrared rays) emitted from the light source and reflected by an external object, thereby detecting the presence of the object.

A conventional optical sensor module can suffer from cross-talk. Cross-talk refers to light received by an optical sensor that was not emitted from the light source and reflected from an object to be detected. Cross-talk is a type of interference or noise that can cause reduced performance of an optical module.

SUMMARY

In accordance with an embodiment of the present disclosure, an optical sensor module is provided. The optical sensor module includes: (1) a lid defining a first chamber and a second chamber isolated from the first chamber; (2) a light emitting component disposed within the first chamber; and (3) a light sensing component disposed within the second chamber; wherein the lid includes a capping substrate and a top of the first chamber and a top of the second chamber are demarcated by the capping substrate, wherein the capping substrate defines a first penetrating hole at the top of the first chamber and a first runner connecting a side wall of the first penetrating hole, and wherein a first lens or a first transmissive panel is formed or disposed in the first penetrating hole and has an extension formed or disposed in the first runner connecting the side wall of the first penetrating hole.

In accordance with another embodiment of the present disclosure, an optical sensor module is provided. The optical sensor module includes: (1) a base substrate with a surface including a light emitting area and a light sensing area; (2) a periphery barrier and a separation component disposed on the surface of the base substrate, wherein the periphery barrier and the separation component together define a first chamber surrounding the light emitting area and a second chamber surrounding the light sensing area, and the separation component separates the first and second chambers; and (3) a capping substrate disposed on the first chamber and the second chamber and defining a first penetrating hole at a top of the first chamber, wherein a first lens or a first transmissive panel is formed or disposed in the first penetrating hole and has a runner portion extending into the capping substrate.

In accordance with another embodiment, a method for manufacturing an optical sensor module is provided. The method includes: (1) providing a base substrate with a light emitting component and a light sensing component disposed thereon; (2) providing a lid defining a first chamber and a second chamber isolated from the first chamber, the lid comprising a capping substrate demarcating a top of the first chamber and a top of the second chamber; and (3) disposing the lid on the base substrate such that the light emitting component is disposed within the first chamber and the light sensing component is disposed within the second chamber, wherein the capping substrate defines a first penetrating hole at the top of the first chamber, a first runner connecting a side wall of the first penetrating hole, a second penetrating hole at the top of the second chamber and a second runner connecting a side wall of the second penetrating hole.

Figure 1A:
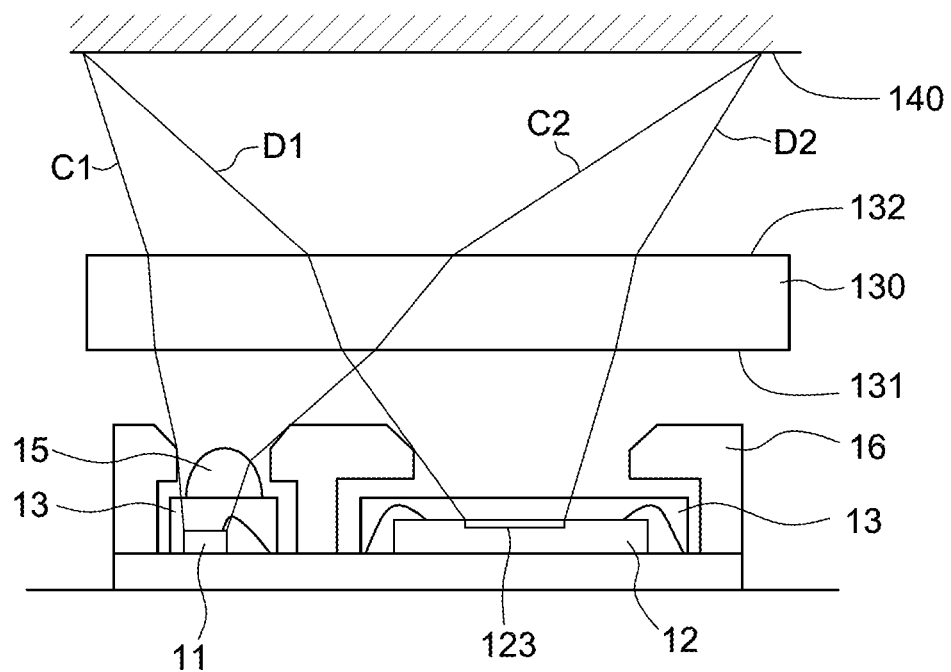
FIG. 1A and FIG. 1B illustrate an example of cross-talk in an optical sensor module.

Common reference numerals are used throughout the drawings and the detailed description to indicate the same or similar components. The present disclosure will be more apparent from the following detailed description taken in conjunction with the accompanying drawings.

DETAILED DESCRIPTION

Figure 1B:
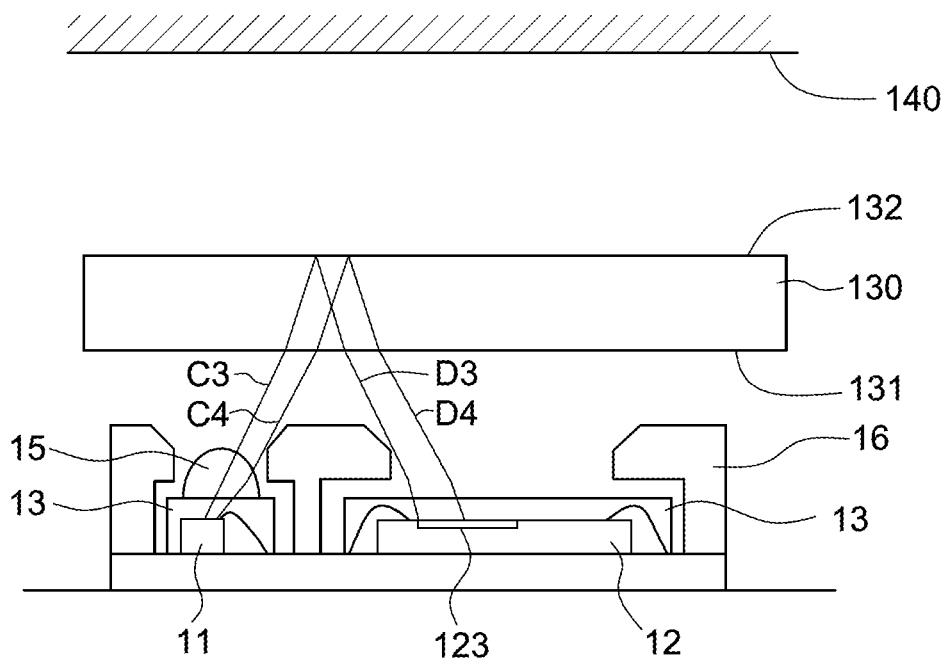

FIGS. 1A and 1B illustrate an optical sensor module and an example of cross-talk in the optical sensor module. As shown in FIG. 1A, a light emitting component 11 and an optical sensor 12 are covered by a transparent molding material 13 for protecting the light emitting component 11 and the optical sensor 12 from the environment; a lens 15 is used to converge the light emitted from the light emitting component 11. Light emitted from the light emitting component 11, illustrated by way of example in a range between C1 and C2, passes through a panel 130, arrives at an external object 140, and is then reflected by the object 140. An example of light reflected by the object 140 is illustrated in a range between D1 and D2. The optical sensor module senses the presence of the object 140 when the light reflected by the object 140 arrives at a light sensing region 123 of the optical sensor 12.

Although a lid 16 is used in the optical sensor module of FIG. 1A to prevent the emitted light from directly entering the light sensing region 123 of the optical sensor 12, about 80% of the emitted light may turn into cross-talk. For example, as shown in FIG. 1B, light illustrated in the range between C3 and C4 emitted from the light emitting component 11 is reflected by a second surface 132 of the panel 130, as illustrated by the range of reflected light between D3 and D4, which enters the light sensing region 123. The light in the range between D3 and D4 is not reflected by the object 140 but by the second surface 132 of the panel 130, and therefore is cross-talk and affects the accuracy of the optical module. Such kind of cross-talk may also be caused by light reflected by a first surface 131 of the panel 130.

Furthermore, the lid 16 can protect the lens 15 from being scratched or damaged; however, the lid 16 may increase the size of the optical module, the complexity of the manufacturing process, the manufacturing cost, and the product cost.

Figure 2A:
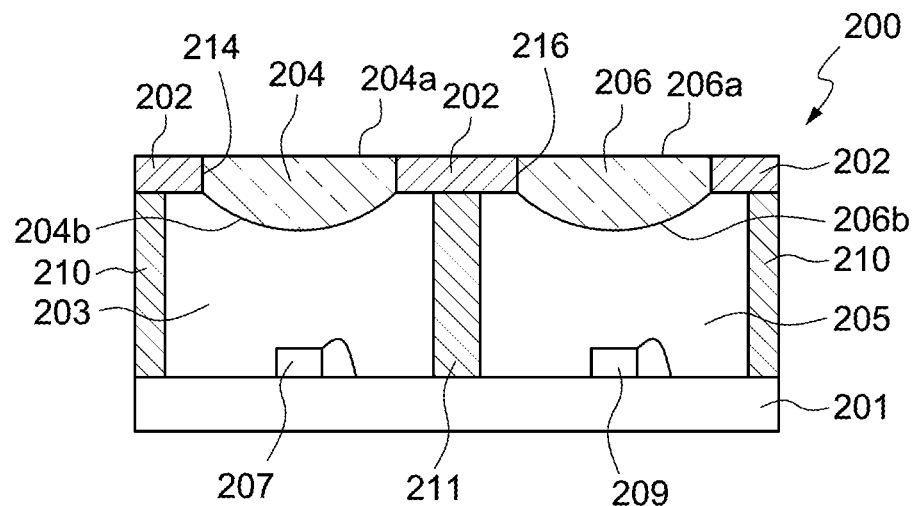
FIG. 2A and FIG. 2B illustrate an optical sensor module in accordance with an embodiment of the present disclosure.
Figure 2B:
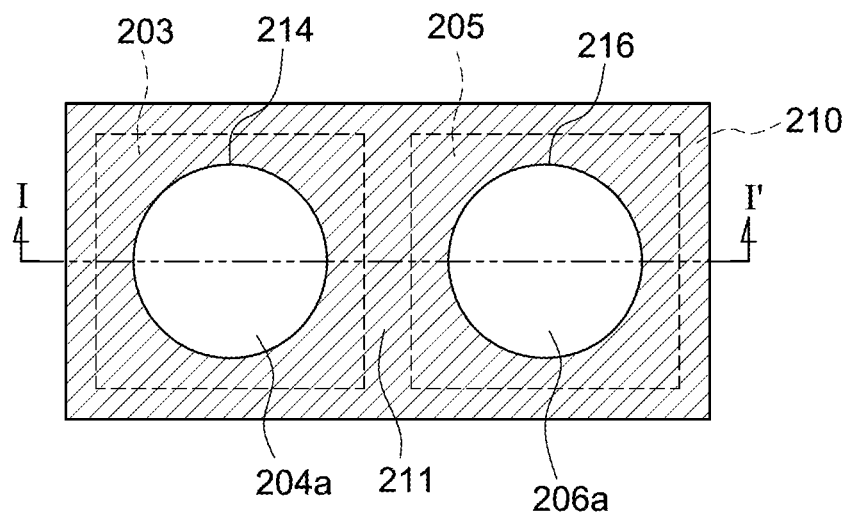

FIG. 2A and FIG. 2B illustrate schematic views of an optical sensor module 200 in accordance with an embodiment of the present disclosure. FIG. 2B illustrates a schematic top view of the optical sensor module 200. FIG. 2A illustrates a cross-sectional view taken along line I-I' of FIG. 2B.

Referring to FIG. 2A, the optical sensor module 200 includes a base substrate 201, a light emitting component 207 and a light sensing component 209 on the base substrate 201, a first lens 204, and a second lens 206. The light emitting component 207 is positioned in a light emitting area (e.g., a receiving area of the base substrate 201 onto which the light emitting component 207 is disposed). The light sensing component 209 is positioned in a light sensing area (e.g., a receiving area of the base substrate 201 onto which the light sensing component 209 is disposed).

The first lens 204 is disposed on the top of a first chamber 203 and has an upper surface 204a and a lower surface 204b. The lower surface 204b of the first lens 204 is a convex surface and faces the light emitting component 207. The upper surface 204a of the first lens 204 is a planar or substantially planar surface, such that the optical sensor module 200 can be attached to another substrate or printed circuit board by a pick-and-place process. Thus, a vacuum nozzle used to pick and place the optical sensor module can directly attach to the planer surface; there is no need to add an additional lid to protect the first lens 204 and provide a planar surface for the pick-and-place process. Therefore, the cost and the thickness of the optical sensor module 200 can be reduced.

The light emitting component 207 is disposed in the first chamber 203 and may emit infrared rays or other wavelengths of light or radiation. In some embodiments, the light emitting component 207 is disposed on the bottom of the first chamber 203. In some embodiments, the position of the light emitting component 207 is adjustable to increase the emitted light passing through the first lens 204. The light emitting component 207 can be, but is not limited to, a light emitting diode or a vertical cavity surface emitting laser (VCSEL). In some embodiments, a VCSEL can reduce the light emission angle (for example, to be within about 20 degrees) and minimize light scattering, thereby reducing cross-talk.

The second lens 206 is disposed on the top of a second chamber 205, and has an upper surface 206a and a lower surface 206b. The second chamber 205 is isolated from the first chamber 203, for example, by a separation component 211 located therebetween. As shown in FIG. 2A, the lower surface 206b of the second lens 206 is a convex surface and faces the light sensing component 209.

The light sensing component 209 is disposed in the second chamber 205 to sense or detect the light reflected by an external object. In some embodiments, the light sensing component 209 is disposed on the bottom of the second chamber 205. In some embodiments, the position of the light sensing component 209 is adjustable to increase the receipt of reflected light passing through the second lens 206. In some embodiments, a center of the light emitting component 207 is offset from an axis of the first lens 204. In some embodiments, a center of the light sensing component 209 is offset from an axis of the second lens 206. The location of the light emitting component 207 and the light sensing component 209 can be adjusted to be close to the separation component 211; the resulting optical sensor module 200 may have better performance than an optical sensor module in which a center of the light emitting component 207 aligns with an axis of the first lens 204 and a center of the light sensing component 209 aligns with an axis of the second lens 206.

Referring to FIG. 2A and FIG. 2B, a capping substrate 202 is formed at the tops of the first and second chambers 203 and 205. The capping substrate 202 includes a first penetrating hole 214 and a second penetrating hole 216. The first and second lenses 204 and 206 are formed in the first and second penetrating holes 214 and 216, respectively. In some embodiments, one (or both) of the first and second lenses 204 and 206 may further be an aspheric lens; in this embodiment, the size of optical sensor module 200 can be reduced.

The upper surface 206a of the second lens 206 is a planar or substantially planar surface. In some embodiments, the upper surface 204a of the first lens 204 and the upper surface 206a of the second lens 206 are substantially coplanar with an upper surface of the capping substrate 202; therefore, no lid is added to protect the lenses, as compared to an embodiment in which a lid is added to protect a portion of one or both of the lenses 204, 206 that protrude beyond the capping substrate 202. Thus, in this embodiment, the size of optical sensor module 200 can be reduced.

In some embodiments, the capping substrate 202 is a metal substrate, such as copper or an alloy thereof. In some embodiments, the capping substrate 202 is a plastic substrate, such as liquid crystal polymer or epoxy resin, or a composite substrate.

In some embodiments, a first light absorbing layer (not shown) is disposed on a lower surface of the capping substrate 202. In some embodiments, the lower surface of the capping substrate 202 (i.e., the lower surface of the capping substrate 202 excluding the first penetrating hole 214 and the second penetrating hole 216) is covered by the first light absorbing layer. In some embodiments, in addition to, or alternatively to, the first light absorbing layer on the lower surface of the capping substrate 202, a second light absorbing layer (not shown) is disposed on an upper surface of the capping substrate 202 (i.e., the upper surface of the capping substrate 202 excluding the first penetrating hole 214 and the second penetrating hole 216). The light absorbing layer or layers absorb at least some emissions (such as infrared or other types of lights or radiations) from the light emitting component 207. Thus, a portion of the capping substrate 202 (a block portion) can block emissions which could result in cross-talk. The area of the block portion is adjustable. The light absorbing layer(s) may be formed, for example, by use of a black oxide treatment, a carbon black coating, a stain, or other suitable light absorbing material. Additionally or alternatively, the capping substrate 202 may include a light absorbing material, such as carbon black or a light absorbing pigment. The use of a light absorbing layer or layers, and/or the use of a light-absorbing material in the capping substrate 202, allows for absorption of emissions from light emitting component 207 not passing through the first lens 204, and the absorption of reflections not passing through the second lens 206; thereby cross-talk can be reduced.

The first chamber 203 and the second chamber 205 are surrounded by a periphery barrier 210 and isolated from each other by the separation component 211, such that the periphery barrier 210 and the separation component 211 define the first chamber 203 and the second chamber 205. In some embodiments, one or more sidewalls of the periphery barrier 210 and the separation component 211 have a light absorbing layer formed thereon, or may be formed of a light absorbing material. The periphery barrier 210 and the separation component 211 connect to the lower surface of the capping substrate 202. The base substrate 201 forms the bottom (in the orientation of FIG. 2A) of optical sensor module 200; thus the bottoms of the first chamber 203 and the second chamber 205 are demarcated by the base substrate 201.

Table 1 illustrates the reduction of cross-talk achieved by an optical sensor module according to this disclosure. Three optical sensor modules A, B and C were tested, and the results are provided in Table 1. Module A was an optical sensor design in accordance with the illustration in FIGS. 2A and 2B. Module B was an optical sensor design such as illustrated in FIGS. 1A and 1B. Module C was a commercial optical sensor module in which a biconvex lens was disposed on each of two chambers. The test performed on each of Modules A, B and C was the detection of an external object at a distance of 10 mm from the optical sensor module.

TABLE 1

|  | Module A | Module B | Module C |
| --- | --- | --- | --- |
| Cross-talk | 0.40% | 68.93% | 0.47% |
| Size of module (mm) | 2.75 × 1.8 × 1.40 | 2.75 × 1.8 × 1.40 | 2.75 × 2.35 × 1.40 |

Comparing Module A and Module B, Module A achieves significantly better cross-talk performance than Module B (i.e., 0.40% cross-talk for Module A versus 68.93% cross-talk for Module B) for about the same size package. Comparing Module A and Module C, Module A is a smaller package size than Module C, and Module A further achieves better cross-talk performance than Module C (i.e., 0.40% cross-talk in Module A versus 0.47% cross-talk in Module C).

Figure 2C:
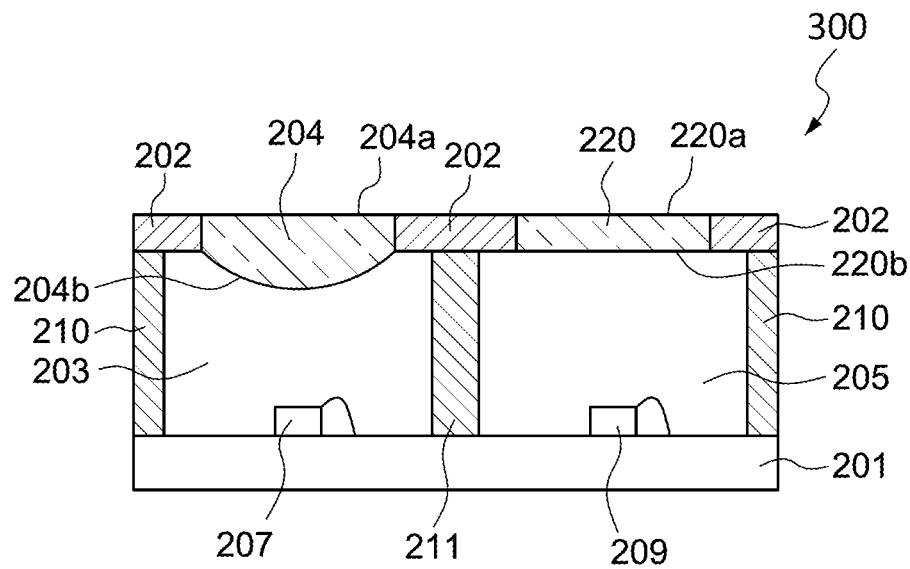
FIG. 2C illustrates an optical sensor module in accordance with an embodiment of the present disclosure.

FIG. 2C illustrates a schematic view of an optical sensor module 300 in accordance with an embodiment of the present disclosure. The optical sensor module 300 shown in FIG. 2C is similar to the optical sensor module 200 shown in FIG. 2A, except that the second lens 206 of FIG. 2A is replaced by a transmissive panel 220 in FIG. 2C. The transmissive panel 220 has an upper surface 220a and a lower surface 220b. The upper surface 220a and the lower surface 220b of the transmissive panel 220 are planar or substantially planar surfaces. In some embodiments, the upper surface 220a is substantially coplanar to the upper surface of capping substrate 202. In some embodiments, the lower surface 220b is substantially coplanar to a lower surface of capping substrate 202. The transmissive panel 220 may be made of a light transmissive material, such as, for example, glass, silicon, a light transmissive polymer (such as a polyimide), or a dry film (such as polyimide film). The transmissive panel 220 may be selected to allow specific wavelengths to pass.

In an alternative embodiment, the transmissive panel 220 can be attached on the upper surface of the capping substrate 202. In this embodiment, the transmissive panel 220 may cover holes in the optical sensor module 300 (e.g., the first and second penetrating holes 214 and 216 in the absence of lens structures formed in the first and second penetrating holes 214 and 216).

Figure 2D:
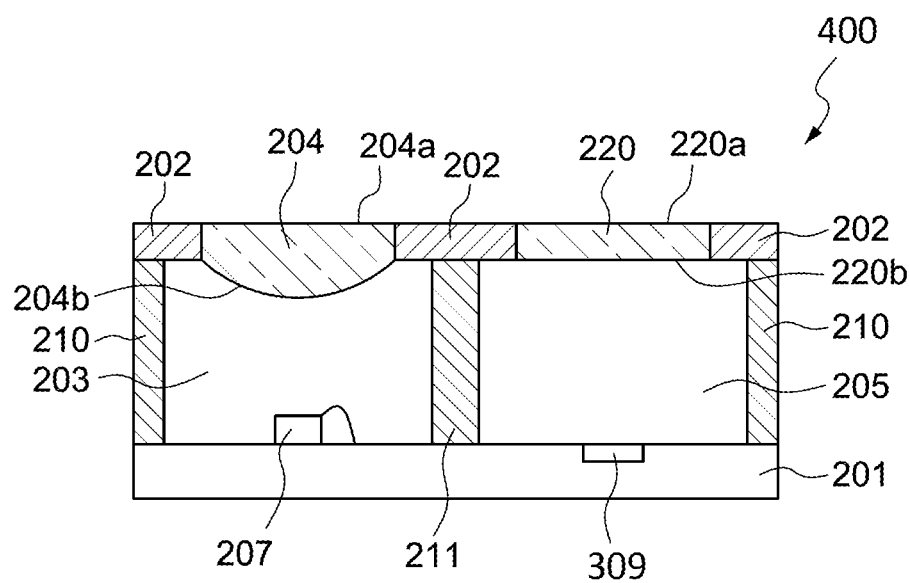
FIG. 2D illustrates an optical sensor module in accordance with an embodiment of the present disclosure.

FIG. 2D illustrates a schematic view of an optical sensor module 400 in accordance with a further embodiment of the present disclosure. The optical sensor module 400 shown in FIG. 2D is similar to the optical sensor module 300 shown in FIG. 2C, where the base substrate 201 in FIG. 2D is implemented by a silicon wafer, and at least one light sensing component 309 is formed in a light sensing area of the silicon wafer. As illustrated in FIG. 2D, the light emitting component 207 may be disposed on and electrically connected to the light emitting area of the base substrate 201. In some embodiments, the light emitting component 207 and the light sensing component 309 can be integrated within a same wafer used to form the base substrate 201.

Figure 3:
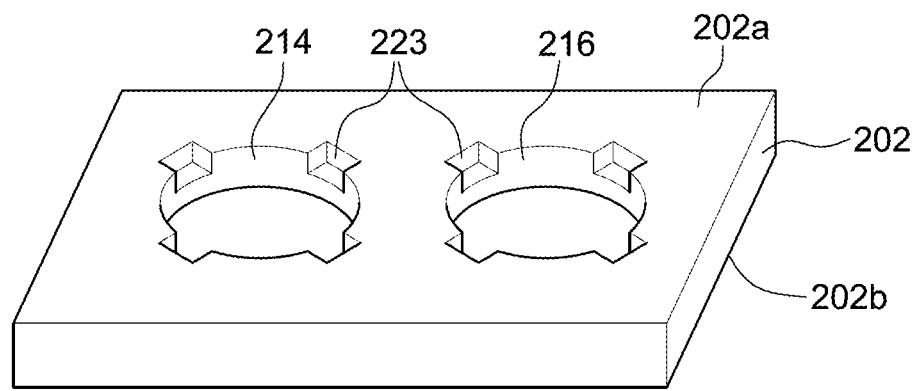
FIG. 3, FIG. 4 and FIG. 5 illustrate a capping substrate according to the embodiments of the present disclosure.

FIG. 3 illustrates a schematic view of the capping substrate 202 in accordance with an embodiment of the present disclosure. As shown in FIG. 3, the capping substrate 202 defines a first penetrating hole 214 and a second penetrating hole 216. The first lens 204 (not shown) is positioned or formed in the first penetrating hole 214, and the second lens 206 (not shown) or the transmissive panel 220 is positioned or formed in the second penetrating hole 216.

As shown in FIG. 3, the side wall of the first penetrating hole 214 and/or the side wall of the second penetrating hole 216 defines one or more grooves 223 extending to the upper surface (labeled as 202a in FIG. 3) of the capping substrate 202 in accordance with some embodiments. In some embodiments, the side wall of the first penetrating hole 214 and/or the side wall of the second penetrating hole 216 additionally or alternatively defines one or more grooves (not shown) extending to the lower surface (labeled as 202b in FIG. 3) of the capping substrate 202. The shape of the grooves is not particularly limited. For example, a groove can be in the shape of a rectangle, a triangle or a cone. The groove(s) may be used to fasten a lens (e.g., the first lens 204 or the second lens 206) to the capping substrate 202.

Figure 4:
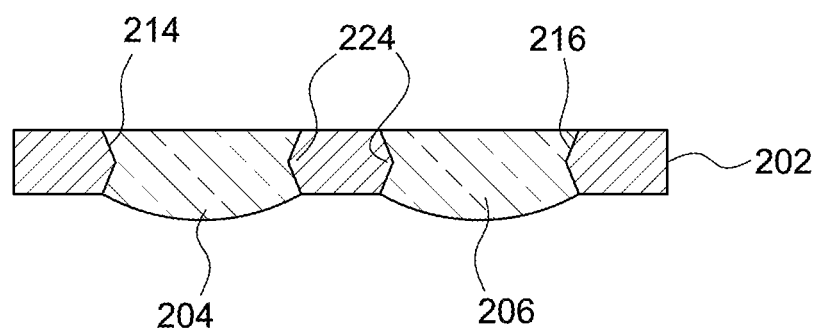

FIG. 4 illustrates a cross-sectional view of the capping substrate 202, with the first lens 204 and the second lens 206 placed or formed within the capping substrate 202. The view of FIG. 4 is taken along line I-I' of FIG. 2B in accordance with some embodiments. As shown in FIG. 4, each of the side walls of the first and second penetrating holes 214 and 216 include a protrusion 224 fitted to, or embedded into, the first lens and the second lens 204 and 206, respectively, so as to more firmly fasten the first lens 204 and the second lens 206 in the capping substrate 202.

Figure 5:
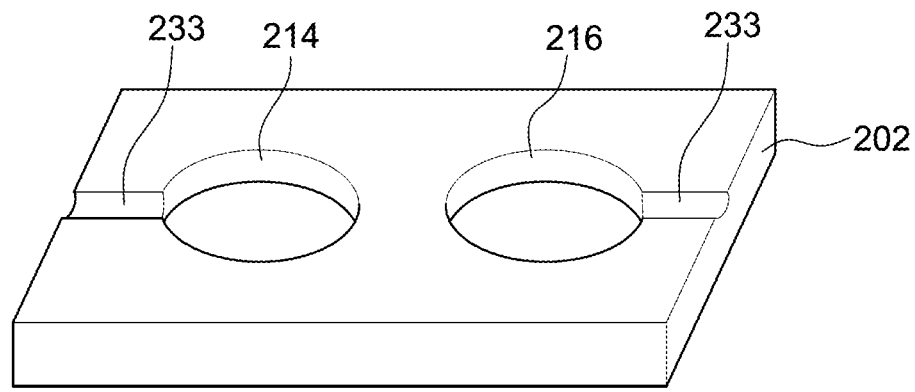

FIG. 5 illustrates a schematic view of the capping substrate 202 in accordance with an embodiment of the present disclosure. In this embodiment, the capping substrate 202 defines one or more runners 233. As shown in FIG. 5, there are two runners 233, each connecting to one of the first penetrating hole 214 and the second penetrating hole 216. In a process for molding lenses, such as a transfer molding or a compression molding, a resin composition for making the lenses may be passed through the runner(s) 233 to fill the first penetrating hole 214 and the second first penetrating hole 216; after being cured, the resin retained in the runners 233 can further fasten the first lens 204 and the second lens 206 (or the transmissive panel 220) in the capping substrate. The runner(s) 233 may be fully buried within the capping substrate 202, or may be partially exposed from the upper surface of the capping substrate 202 (as illustrated in FIG. 5).

Figure 6A:
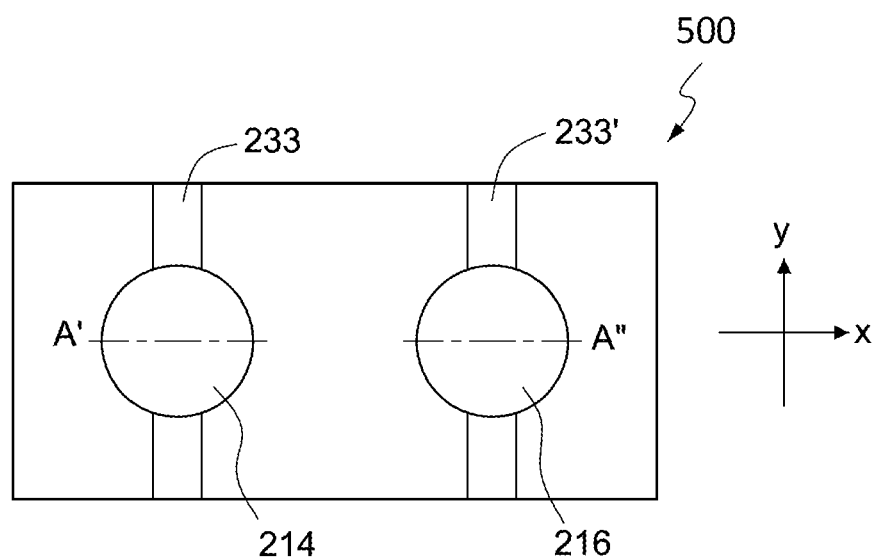
FIG. 6A and FIG. 6B illustrate the optical sensor modules with different arrangement of lenses according to the embodiments of the present disclosure.

FIG. 6A illustrates a schematic top view of an optical sensor module 500 in accordance with an embodiment of the present disclosure. In FIG. 6A, a runner 233 connects the side wall of the first penetrating hole 214 and a runner 233' connects the side wall of the second penetrating hole 216. The runner 233 is substantially parallel to runner 233'. In addition, a first line A' parallel to a reference axis x and passing through the center of the first penetrating hole 214 is collinear with a second line A" parallel to the reference axis x and passing through the center of the second penetrating hole 216.

Figure 6B:
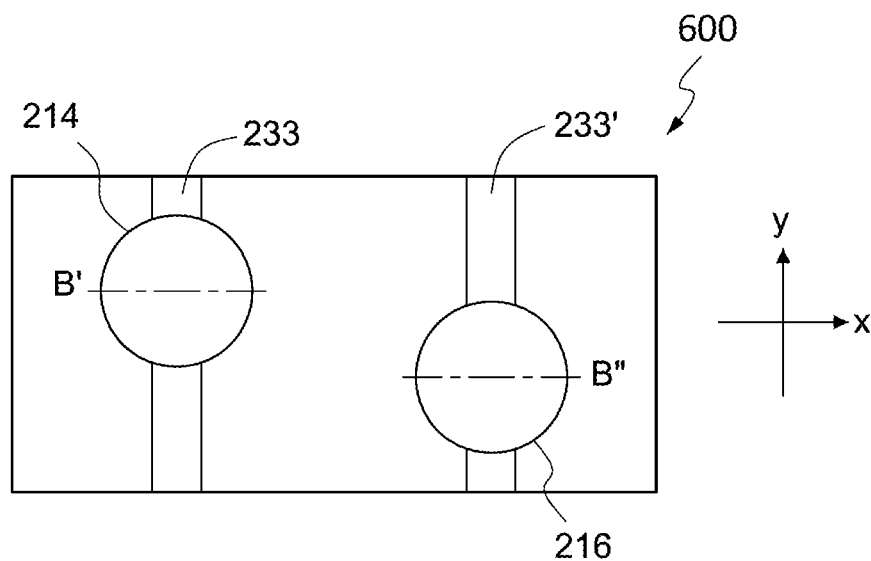

FIG. 6B illustrates a schematic top view of an optical sensor module 600 in accordance with an embodiment of the present disclosure. As shown in FIG. 6B, a first line B' parallel to a reference axis x and passing through the center of the first penetrating hole 214 is not collinear with a second line B" parallel to the reference axis x and passing through the center of the second penetrating hole 216. It has been found that as compared to the arrangement of FIG. 6A, the arrangement of FIG. 6B may provide further cross-talk reduction (for example, from 0.15% to 0.07%).

Figure 7A:
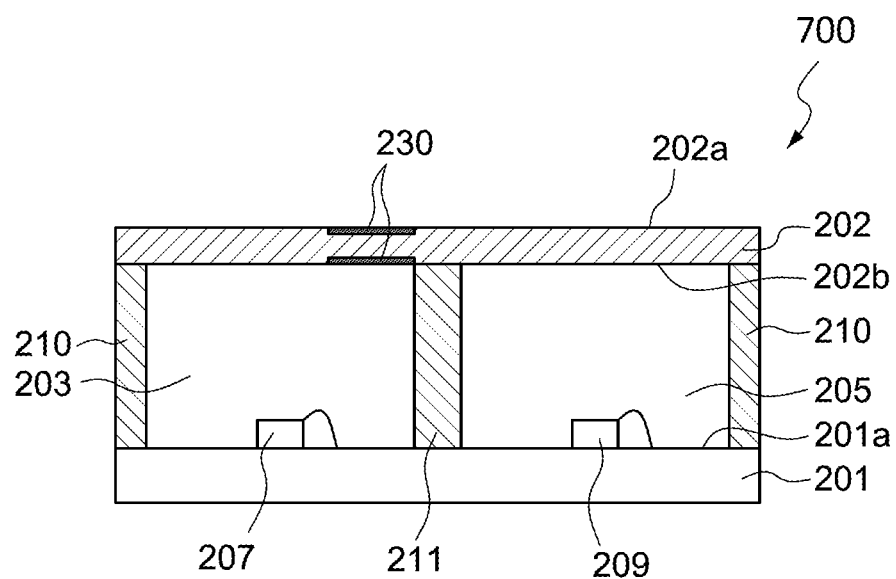
FIG. 7A, FIG. 7B and FIG. 7C illustrate an optical sensor module in accordance with further embodiments of the present disclosure.

FIG. 7A illustrates a schematic view of an optical sensor module 700 in accordance with further embodiments of the present disclosure. The optical sensor module 700 includes a base substrate 201 with a first surface 201a, a periphery barrier 210, and a separation component 211 disposed on the first surface 201a of the base substrate 201. The first surface 201a includes a light emitting component 207 and a light sensing component 209. The periphery barrier 210 and the separation component 211 define a first chamber 203 surrounding the light emitting component 207 and a second chamber 205 surrounding the light sensing component 209. The first chamber 203 and the second chamber 205 are isolated from each other by the separation component 211 disposed therebetween. The light emitting component 207 in the first chamber emits light of about a first wavelength (e.g., within a range of wavelengths including the first wavelength).

The optical sensor module 700 includes a capping substrate 202 disposed on the top of the first chamber 203 and the second chamber 205. The capping substrate 202 may be made of light transmissive material or light blocking material. The upper surface 202a of the capping substrate 202 is planar. The capping substrate 202 in this embodiment includes a block portion 230, which is capable of blocking or absorbing light of about the first wavelength. The block portion 230 is located at the top of the first chamber (e.g., on one or both of the lower surface 202b of the capping substrate 202 and the upper surface 202a of the capping substrate 202). In some embodiments, the block portion 230 may be disposed adjacent to (e.g., directly adjacent to) the separation component 211. With such an arrangement, emissions that could cause cross-talk (e.g., light in the range between C3 and C4 in FIG. 1B) would be blocked or absorbed by the block portion 230 so that the cross-talk can be reduced. The block portion 230 may be made of a material that blocks or absorbs light of about the first wavelength. In some embodiments, the block portion 230 may be additionally or alternatively disposed on the upper surface of the capping substrate 202 over the second chamber 205, and may be adjacent to the separation component 211. In such an embodiment, the block portion 230 can block or absorb cross-talk or other unwanted light of about the first wavelength. Examples of emissions of the first wavelength include narrow-band emissions with wavelengths in the range 850 nanometers (nm) to 950 nm.

Figure 7B:
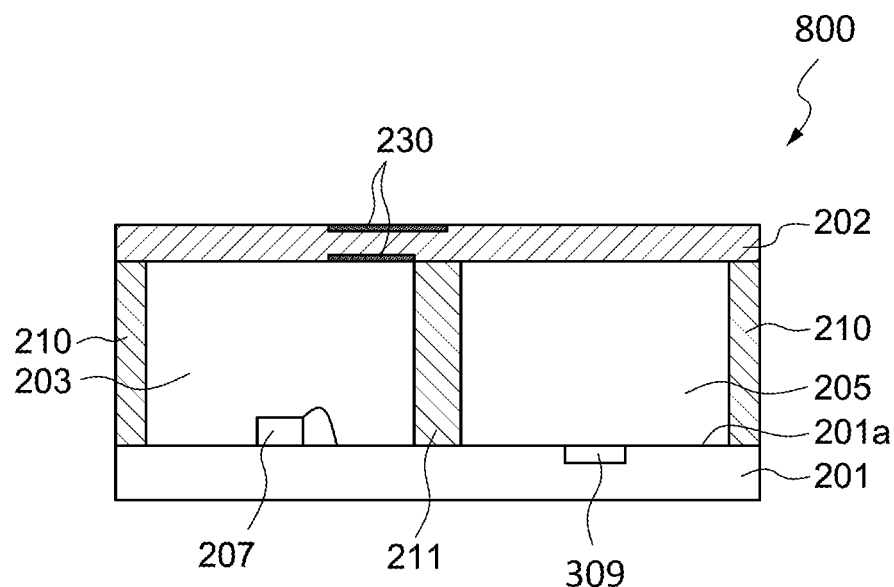

FIG. 7B illustrates a schematic view of an optical sensor module 800 in accordance with an embodiment of the present disclosure. The optical sensor modules of FIGS. 7A and 7B have similar structure to each other except that in FIG. 7A, the light sensing component 209 is positioned on the base substrate 201, whereas in FIG. 7B, the light sensing component 309 is buried or embedded in the base substrate 201. A further difference between FIGS. 7A and 7B is the size and/or position of the block portion 230.

Figure 7C:
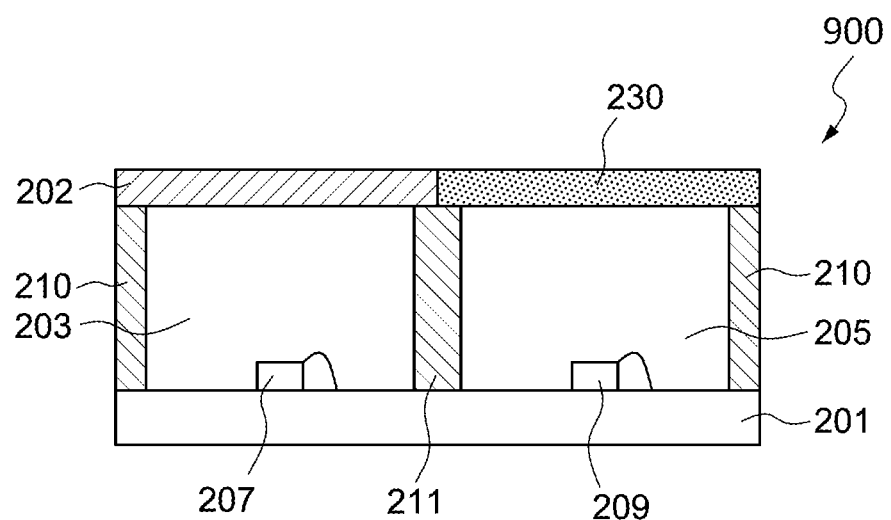

FIG. 7C illustrate a schematic view of an optical sensor module 900 in accordance with an embodiment of the present disclosure. The optical sensor module 900 shown in FIG. 7C is similar to that shown in FIG. 7A, except with respect to the block portion 230.

In FIG. 7C, the block portion 230 is located on the top of the second chamber 205 such that emissions of about the first wavelength from the first chamber 203 would not enter the second chamber 205. In some embodiments, as illustrated in FIG. 7C, the block portion 230 is a section of the capping substrate 202 including all, or a substantial portion, of the capping substrate 202 that lies over the second chamber 205, and the block portion 230 occupies the full volume of the section. In other embodiments, the block portion 230 is on one or both of the upper surface 202a and the lower surface 202b of the capping substrate 202, and covers at least the second chamber 205.

The block portion 230 may be made of a material that blocks emissions having about a first wavelength but allows emissions having about a second wavelength to pass. Silicon is one example of such a material. In some embodiments, the first wavelength is that of near-infrared or visible light, and the second wavelength is that of mid-wavelength infrared or far infrared light. In other embodiments, the first and the second wavelengths may be close in value. In some embodiments, light having wavelengths between 850 nm and 950 nm is emitted from the first chamber 203, and the second chamber 205 is capped by a block portion 230 that blocks light having wavelengths between 850 nm and 950 nm but allows light of other wavelengths (e.g., micrometer wavelengths) to pass and be detected by the light sensing component 209 or 309 of the second chamber 205.

In the embodiment shown in FIG. 7C, the second chamber 205 may be used, for example, to detect human physiological parameters, such as human temperature. For such a use, the optical sensor module 900 may further include a third chamber (not shown), which is a light sensing chamber and forms a proximity sensor together with the first chamber. The first, second and third chambers of such a proximity sensor module can be defined by a periphery barrier and two separation components disposed on the base substrate and isolated from each other by the separation components. In some embodiments of a proximity sensor module with three chambers, the second chamber 205 can be designed for detecting a pulse or oxygen saturation, such that the first chamber 203 emits green light or red light.

The optical sensor module according to some embodiments of the present disclosure (such as illustrated and described for optical sensor modules 200, 300, 400, 500, 600, 700, 800 and 900) is an air-type optical sensor module, which is substantially airtight without applying a molding compound or other encapsulant to encapsulate the light emitting component or the light sensing component. Chambers (e.g., 203, 205) are enclosed by a capping substrate (e.g., 202), a base substrate (e.g., 201), a periphery barrier (e.g., 210) and one or more separation component(s) (e.g., 211) to form a closed space such that influences from the external environment (e.g., humidity) can be reduced. Moreover, as compared to an optical sensor module as illustrated in FIG. 1A, the optical sensor module of some embodiments of the present disclosure allows for two refractions of incident light (e.g., one when light enters the lens from the air in the first chamber, and the other when light enters the ambient air from the lens), and thus, can more efficiently condense the light; as a result, the package size can be reduced.

Figure 8A:
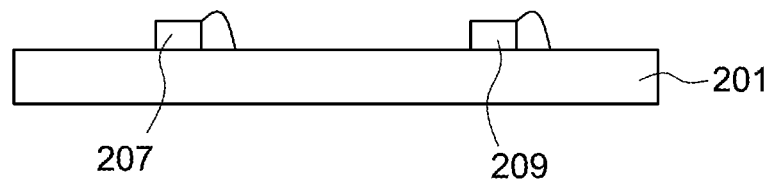
FIG. 8A and FIG. 8B illustrate a method for manufacturing an optical sensor module according to an embodiment of the present disclosure.
Figure 8B:
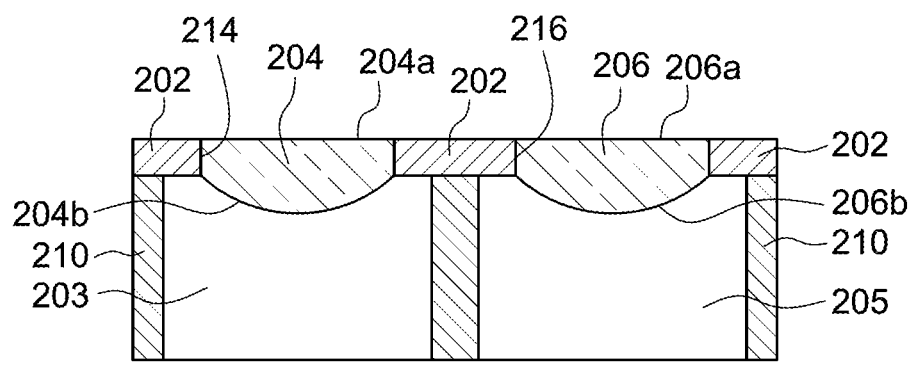
Figure 8B:
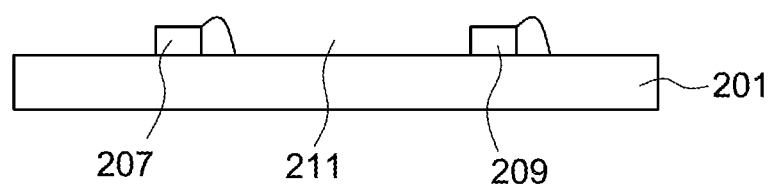

FIGS. 8A and 8B illustrate a method for manufacturing an optical sensor module in accordance with an embodiment of the present disclosure.

FIG. 8A illustrates providing a base substrate 201. The base substrate 201 includes a light emitting component 207 and a light sensing component 209 disposed thereon.

FIG. 8B illustrates providing a lid and disposing the lid on the base substrate 201. The lid includes a capping substrate 202, a first chamber 203; a second chamber 205 isolated from the first chamber 203; a first lens 204 disposed at the top of the first chamber 203; and a second lens 206 disposed at the top of the second chamber 205. A lower surface 204b of the first lens 204 is a convex surface, and an upper surface 204a of the first lens is a substantially planar surface. A lower surface 206b of the second lens 206 is a convex surface, and an upper surface 206a of the second lens is a substantially planar surface. In some embodiments, the second lens 206 can be replaced by a transmissive panel 220 (e.g., as shown in FIG. 2C). The upper surface 204a of the first lens 204 and the upper surface 206a of the second lens 206 (or the upper surface of the transmissive panel 220) are substantially coplanar with each other and with a top surface of the capping substrate 202. As illustrated in FIG. 8B, the lid is disposed on the base substrate 201 such that the lower surface 204b of the first lens 204 faces the light emitting component 207, and the lower surface 206b of the second lens 206 (or the lower surface of the transmissive panel 220) faces the light sensing component 209.

FIGS. 9A to 9D illustrate providing a lid according to an embodiment of the present disclosure.

Figure 9A:
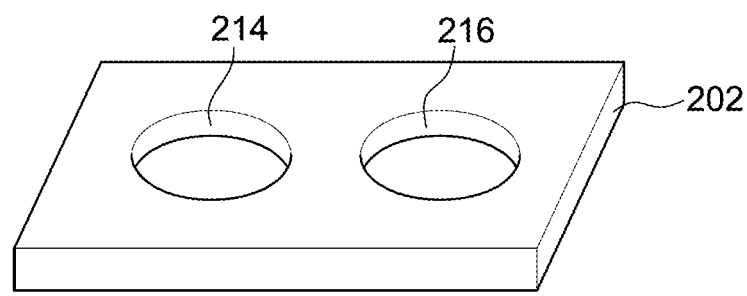
FIG. 9A, FIG. 9B, FIG. 9C and FIG. 9D illustrate a step of providing the lid according to some embodiments of the present disclosure.

In FIG. 9A, a capping substrate 202 with a first penetrating hole 214 and a second penetrating hole 216 is provided. The capping substrate 202 may be a metal substrate (e.g., made of copper, aluminum, or other metal or alloy) a wafer (e.g., a silicon wafer or a glass wafer) a plastic substrate made of a liquid crystal polymer, an epoxy resin, or a composite substrate. The side walls of the first penetrating hole 214 and the second penetrating hole 216 may define a groove or a protrusion as described with respect to FIGS. 3 and 4 (not shown in FIG. 9A). The first penetrating hole 214 and the second penetrating hole 216 may be formed by etching or other hole-forming technique, such as laser drilling. The groove and the protrusion can be formed together with the formation of the first penetrating hole 214 and the second penetrating hole 216. In some embodiments, the groove may be formed in a subsequent etching or laser drilling process.

Figure 9B:
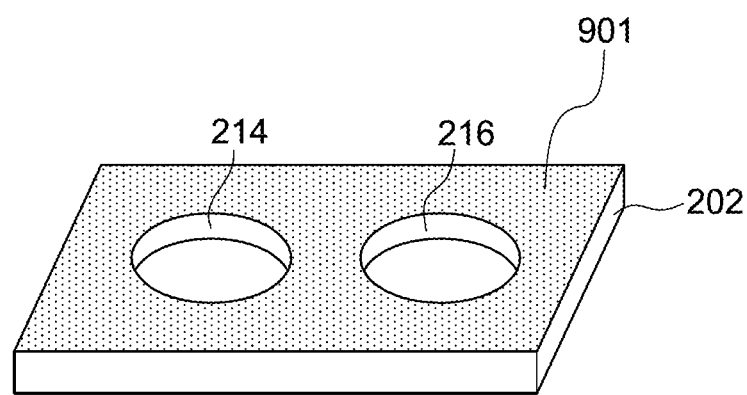

In FIG. 9B, a light absorbing layer 901, such as a black oxide treatment layer, is formed on the capping substrate 202. For example, the light absorbing layer 901 may be formed on one or both of a top surface and a bottom surface of the capping substrate 901. In some embodiments, the light absorbing layer 901 may be formed within the capping substrate 202 by adding carbon black or other pigment(s) in the capping substrate. The light absorbing layer 901 may be omitted in some embodiments.

Figure 9C:
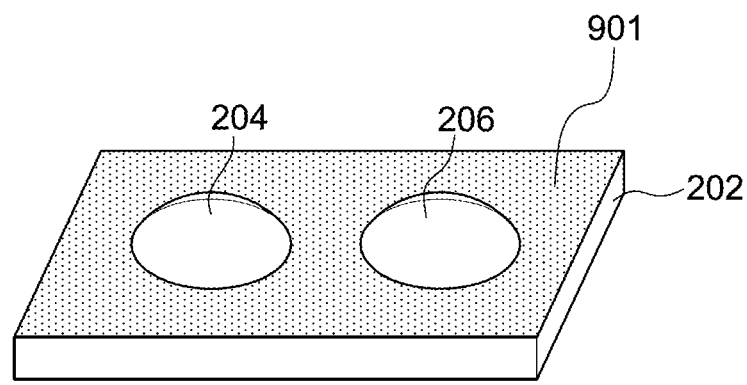

In FIG. 9C, a polymer is injected into the first penetrating hole 214 and the second penetrating hole 216 of the capping substrate 202; and, after curing, forms the first lens 204 and the second lens 206. When the first penetrating hole 214 and/or the second penetrating hole 216 contain a groove as describe above (e.g., as in FIG. 3), the polymer fills the first penetrating hole 214, the second penetrating hole 216 and the groove. Each of the first and second lenses 204, 206 has a convex surface and a non-convex surface. The non-convex surfaces are preferably substantially planar. In some embodiments, rather than forming the second lens 206, the injected polymer is used to form a transmissive panel (e.g., 220). In some embodiments, in addition to filling the first penetrating hole 214, the second penetrating hole 216 and the groove, the polymer also covers portions of an upper surface of the capping substrate 202 to form a transmissive panel.

In some embodiments, the capping substrate includes a runner (e.g., as described with respect to FIGS. 5, 6A and 6B), and the polymer is injected into the first penetrating hole 214 and the second penetrating hole 216 by passing through the runner.

Figure 9D:
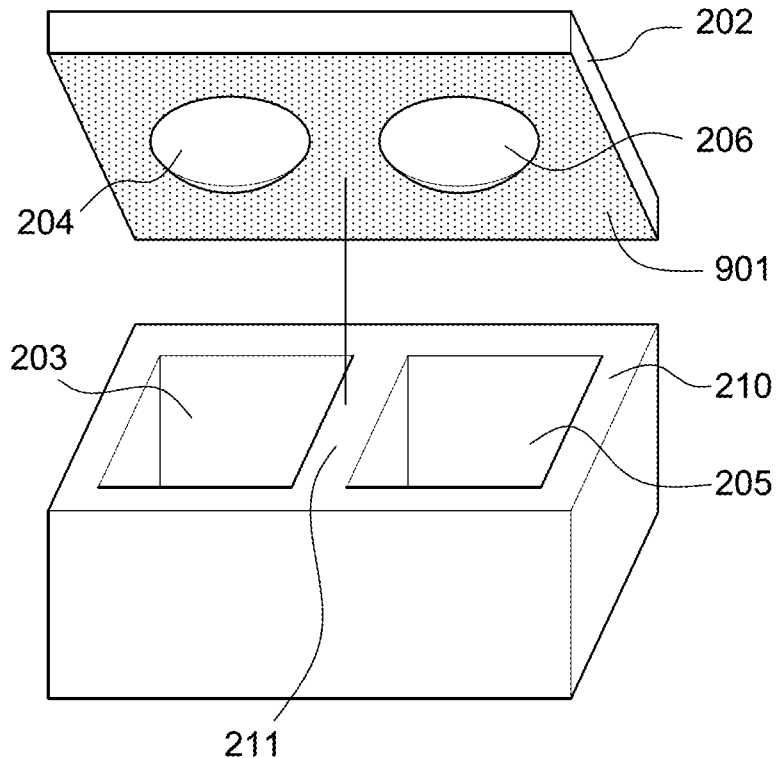

In FIG. 9D, a periphery barrier 210 and a separation component 211 are provided and attached to the capping substrate 202. In some embodiments, the periphery barrier 210 and the separation component 211 can be made from a wafer, such as by forming the cavities of the first chamber 203 and the second chamber 205 in the wafer. The capping substrate 202 forms the top of the lid while the periphery barrier 210 forms the side walls of the lid. The first chamber and the second chamber of the lid are defined by the periphery barrier 210 and the separation component 211, and the tops of the first and second chambers are demarcated by the capping substrate 202. The capping substrate 202 is attached to the periphery barrier 210 and the separation component 211 in a manner such that the convex surfaces of the first lens 204 and the second lens 206 face inward towards the first chamber 203 and the second chamber 205, respectively. The non-convex surfaces of the first lens 204 and the second lens 206 and the upper surface of the capping substrate 202 are substantially coplanar; therefore, the capping substrate 202 with the first lens 204 and the second lens 206 can be easily moved and attached to the periphery barrier 210 and the separation component 211 for example, by a vacuum nozzle. By way of comparison, if the first lens 204 or the second lens 206 were to protrude from the upper surface of the capping substrate 202, an additional cover may be needed to protect the lens and to facilitate the attaching process, which would increase the size of the optical sensor module and the complexity of the manufacturing of the optical sensor module. In the embodiment of FIG. 9D, the periphery barrier 210 and the separation component 211 are positioned such that a light absorbing layer 901 is on the side of the capping substrate 202 facing towards the first chamber 203 and the second chamber 205. In other embodiments, the periphery barrier 210 and the separation component 211 are positioned such that a light absorbing layer 901 formed on the opposite side of the capping substrate 202 faces away from the first chamber 203 and the second chamber 205. In yet other embodiments, the light absorbing layer 901 is omitted, or there is a light absorbing layer 901 on both sides of the capping substrate 202.

Figure 10A:
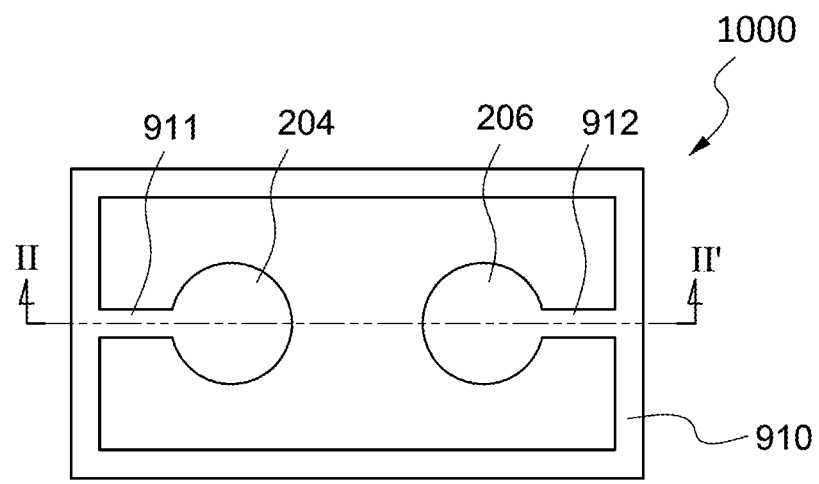
FIG. 10A, FIG. 10B, FIG. 10C, FIG. 10D and FIG. 10E illustrate a step of providing the lid according to another embodiment of the present disclosure.
Figure 10B:
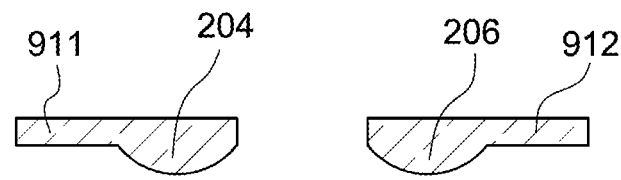

FIGS. 10A through 10D illustrate providing the lid according to an embodiment of the present disclosure. FIG. 10A illustrates a schematic top view of a molding lens 1000 including a frame 910, a first lens 204 connected to the frame 910 by a first runner 911 and a second lens 206 (or a transmissive panel) connected to the frame 910 by a second runner 912. The molding lens 1000 may be formed, for example, by transfer molding or compression molding. In some embodiments, a polymer is injected into a die with a pre-determined pattern of lenses (and optionally transmissive panels). FIG. 10B illustrates a cross-sectional view of the molding lens 1000 taken along line of FIG. 10A.

Figure 10C:
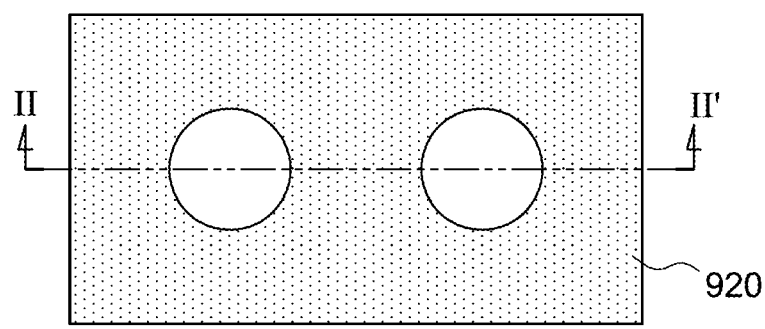
Figure 10D:
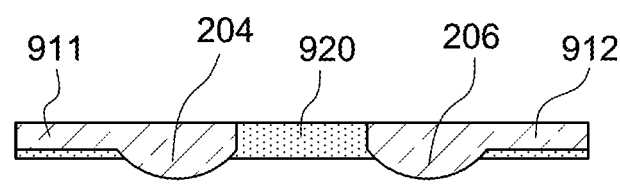

FIG. 10C illustrates a molding compound layer 920 applied (as shown in FIG. 10D) so as to cover the frame 910, the first runner 911 and the second runner 912, and to expose the first lens 204 and the second lens 206 (or transmissive panel).

Figure 10E:
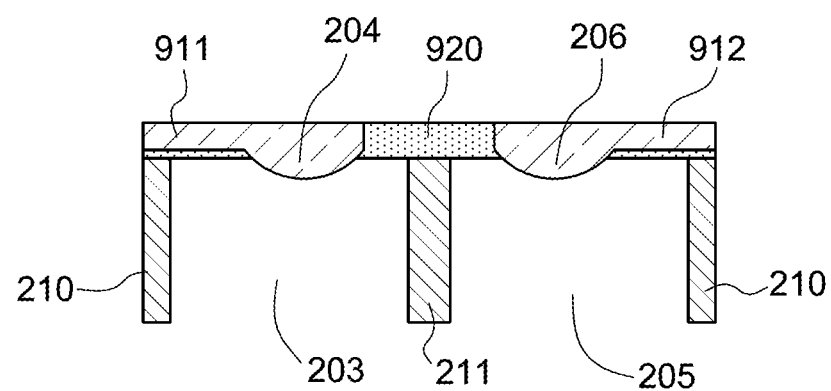

In FIG. 10E, a periphery barrier 210 and a separation component 211 are attached to the molding compound layer 920. The molding compound layer 920 and the molding lens 1000 together form the top of the lid, while the periphery barrier 210 forms the side walls of the lid. A first chamber 203 is defined by the periphery barrier 210 and the separation component 211, and demarcated by the downward-facing surface of the molding compound layer 920. A second chamber 205 is defined by the periphery barrier 210 and the separation component 211, and demarcated by the downward-facing surface of the molding compound layer 920. The first lens 204 and the second lens 206 each have a convex surface and a non-convex surface, where the non-convex surfaces are the downward facing surfaces of the corresponding lenses. The non-convex surface of the first lens 204 is a substantially planar surface; therefore, the molding lens 1000 with the molding compound layer 920 applied thereon (e.g., as in FIG. 10D) can be easily moved and attached to the periphery barrier 210 and the separation component 211; for example, by a vacuum nozzle. Preferably, both of the non-convex surfaces of the first lens 204 and the second lens 206 are substantially planar surfaces, and substantially coplanar with a top surface of the lid as formed (e.g., the upper surfaces of the first runner 911, the second runner 912, the first lens 204, the second lens 206, and the molding compound layer 920 are substantially coplanar as illustrated in FIG. 10D). However, if one or both of the first lens 204 and the second lens 206 protrude from the top surface of the lid, an additional cover may be applied to protect the lens and to facilitate the attaching process.

After providing the lid in accordance with FIGS. 9A to 9D or FIGS. 10A to 10E, the lid is disposed on the base substrate (e.g., 201) such that the downward-facing surface of the first lens (e.g., 204) faces the light emitting component (e.g., 207), and the downward-facing surface of second lens (e.g., 206, or a transmissive panel) faces the light sensing component (e.g., 209, 309).

In some embodiments, the optical sensor module according to the present disclosure can be integrated into a portable electronic device with a screen.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

A surface can be deemed to be planar or substantially planar if a difference between a highest point and a lowest point on the surface is small, such as no greater than 1 μm, no greater than 5 μm, no greater than 10 μm, or no greater than 50 μm. Two surfaces can be deemed to be coplanar or substantially coplanar if a displacement between the two surfaces is small, such as no greater than 1 μm, no greater than 5 μm, no greater than 10 μm, or no greater than 50 μm.

Amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical sensor module, comprising:
   a lid defining a first chamber and a second chamber separated from the first chamber;
   a light emitting component disposed within the first chamber; and
   a light sensing component disposed within the second chamber;
   wherein the lid comprises a capping substrate,
   wherein the capping substrate defines a first penetrating hole at a top of the first chamber and a first runner connecting a side wall of the first penetrating hole,
   wherein a first lens is formed or disposed in the first penetrating hole, the first lens comprises a curved surface in the first penetrating hole and facing the light emitting component, and the first lens has an extension formed or disposed in the first runner connecting the side wall of the first penetrating hole, wherein the capping substrate comprises a support portion extending under the curved surface of the first lens for supporting the first lens; and wherein the curved surface of the first lens is protruding out of a bottom surface of the support portion.

2. The optical sensor module of claim 1, wherein a projection of the support portion is within a projection of the curve surface of the first lens as viewed from a direction in parallel to an extending direction of the support portion.

3. The optical sensor module of claim 1, wherein the first runner has a curved surface, and the extension of the first lens is in direct contact and conformal with the curved surface of the first runner.

4. The optical sensor module of claim 1, wherein the capping substrate further defines a second penetrating hole at a top of the second chamber and a second runner connecting a side wall of the second penetrating hole, and wherein a second lens or a second transmissive panel is formed or disposed in the second penetrating hole and has an extension formed or disposed in the second runner connecting the side wall of the second penetrating hole.

5. The optical sensor module of claim 1, wherein the support portion comprises a ring-shaped structure, a center of curvature of a side wall of the ring-shaped structure and a center of curvature of the curved surface of the first lens are located on a first side of the capping substrate, and the light emitting component and the light sensing component are located on a second side opposite to the first side of the capping substrate.

6. The optical sensor module of claim 1, wherein the support portion comprises a convex curved surface in direct contact and conformal with the curved surface of the first lens.

7. The optical sensor module of claim 4, wherein a first line parallel to a reference axis and passing through a center of the first lens is collinear with a second line parallel to the reference axis and passing through a center of the second lens or the second transmissive panel.

8. The optical sensor module of claim 4, wherein a first line parallel to a reference axis and passing through a center of the first lens is not collinear with a second line parallel to the reference axis and passing through a center of the second lens or the second transmissive panel.

9. The optical sensor module of claim 1, wherein the side wall of the first penetrating hole comprises a plurality of recessed portions that define a plurality of grooves extending to an upper surface of the capping substrate and spaced apart from an edge of the capping substrate, and the plurality of grooves substantially surround the first penetrating hole and are arranged in a symmetric fashion.

10. The optical sensor module of claim 4, wherein the second penetrating hole has the side wall that defines grooves extending to an upper surface of the capping substrate, the second runner disposed on a lower surface of the capping substrate.

11. The optical sensor module of claim 1, wherein the support portion and a portion of the side wall of the first penetrating hole define an angled recess, and a portion of the first lens is in contact with and conformal with the angled recess.

12. The optical sensor module of claim 1, wherein the lid further comprises a periphery barrier and a separation component connected to a lower surface of the capping substrate and defining the first chamber and the second chamber.

13. The optical sensor module of claim 1, wherein the first runner is fully buried in the capping substrate or partially exposed from an upper surface of the capping substrate.

14. The optical sensor module of claim 4, wherein the first runner is substantially parallel to the second runner.

15. The optical sensor module of claim 1, wherein a portion of the first lens in the first penetrating hole has a first upper surface facing away from the light emitting component, the extension of the first lens has a second upper surface facing away from the light emitting component, and the first upper surface is substantially coplanar with the second upper surface.

16. An optical sensor module, comprising:

a base substrate with a surface including a light emitting area and a light sensing area;

a periphery barrier and a separation component disposed on the surface of the base substrate, wherein the periphery barrier and the separation component together define a first chamber surrounding the light emitting area and a second chamber surrounding the light sensing area, and the separation component separates the first and second chambers; and a capping substrate disposed on the first chamber and the second chamber and defining a first penetrating hole at a top of the first chamber, wherein a first lens is formed or disposed in the first penetrating hole, the first lens comprises a first portion and a runner portion, the first portion of the first lens has a part in the first penetrating hole and facing the light emitting area, and the runner portion of the first lens extends into the capping substrate, wherein a thickness of the first portion of the first lens is greater than a thickness of the runner portion of the first lens;

wherein the capping substrate comprises a support portion extending under the first portion of the first lens for supporting the first lens; and wherein the support portion is in direct contact with the runner portion and a curved surface of the first portion of the first lens, and the support portion is conformal with an exterior profile of the runner portion and a peripheral region of the curved surface of the first portion of the first lens.

17. The optical sensor module of claim 16, wherein a curvature of the runner portion is greater than a curvature of the curved surface of the first portion of the first lens.

18. The optical sensor module of claim 16, wherein the first chamber is configured to provide light having a first wavelength from the light emitting area and the capping substrate comprises a block portion for blocking light having the first wavelength from the light emitting area.

19. The optical sensor module of claim 16, wherein the support portion surrounds the part of the first portion of the first lens.

20. The optical sensor module of claim 16, wherein the first portion of the first lens in the first penetrating hole has a first upper surface facing away from the light emitting area, the runner portion of the first lens has a second upper surface facing away from the light emitting area, and the first upper surface is substantially coplanar with the second upper surface.

* * * * *